(12) United States Patent
Catabay et al.

(10) Patent No.: US 6,232,658 B1
(45) Date of Patent: May 15, 2001

(54) PROCESS TO PREVENT STRESS CRACKING OF DIELECTRIC FILMS ON SEMICONDUCTOR WAFERS

(75) Inventors: Wilbur G. Catabay, Saratoga; Wei-Jen Hsia, Sunnyvale; Joe W. Zhao, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/346,493

(22) Filed: Jun. 30, 1999

(51) Int. Cl.$^7$ .................................................. H01L 23/53
(52) U.S. Cl. ......................... 257/701; 438/455; 438/778; 438/981
(58) Field of Search ................................. 257/701, 632, 257/635, 644, 650, 467, 506; 438/50, 54, 761, 778, 981, 455

(56) References Cited

U.S. PATENT DOCUMENTS

| | | | |
|---|---|---|---|
| 3,012,861 | 12/1961 | Ling | 23/223.5 |
| 3,178,392 | 4/1965 | Kriner | 260/46.5 |
| 3,652,331 | 3/1972 | Yamazaki | 117/201 |
| 3,832,202 | 8/1974 | Ritchie | 106/287 |
| 3,920,865 | 11/1975 | Läufer et al. | 427/220 |
| 4,705,725 | 11/1987 | Glajch et al. | 428/405 |
| 4,771,328 * | 9/1988 | Malaviya et al. | 357/49 |
| 5,194,333 | 3/1993 | Ohnaka et al. | 428/405 |
| 5,364,800 * | 11/1994 | Joyner | 437/28 |
| 5,470,801 * | 11/1995 | Kapoor et al. | 437/238 |
| 5,688,724 * | 11/1997 | Yoon et al. | 437/235 |
| 5,858,879 | 1/1999 | Chao et al. | 438/725 |
| 5,864,172 * | 1/1999 | Kapoor et al. | 257/635 |
| 5,874,745 | 2/1999 | Kuo | 257/59 |
| 5,882,489 | 3/1999 | Bersin et al. | 204/192.35 |
| 5,904,154 | 5/1999 | Chien et al. | 134/1.2 |
| 5,939,763 * | 8/1999 | Hao et al. | 257/411 |
| 6,025,263 * | 2/2000 | Tsai et al. | 438/761 |
| 6,051,477 * | 4/2000 | Nam | 438/778 |
| 6,066,574 * | 5/2000 | You et al. | 438/778 |

OTHER PUBLICATIONS

Koda, Seiichiro, et al., "A Study of Inhibition Effects for Silane Combustion by Additive Gases", *Combustion and Flame*, vol. 73, No. 2 Aug., 1998, pp. 187–194.

* cited by examiner

*Primary Examiner*—Don Wong
*Assistant Examiner*—Thuy Vinh Tran
(74) *Attorney, Agent, or Firm*—John P. Taylor

(57) ABSTRACT

The invention comprises a process for forming a dielectric film having a compressive stress exhibited in the layers deposited onto an integrated circuit structure. This process includes depositing a first thin layer of dielectric material onto an integrated circuit structure, then exposing the integrated circuit structure to an elevated temperature. Then a second thin layer of dielectric material is deposited immediately overtop of the first thin layer of dielectric material, and then the integrated circuit structure is again exposed to an elevated temperature. The process is carried out to insure that the composite layer comprising the first and second deposited thin dielectric layers, after heat treatment, exhibits a residual stress which is compressive. The steps of depositing an additional thin dielectric layer and then exposing the semiconductor wafer to an elevated temperature may be repeated until a sufficient composite thickness of dielectric material has been formed, typically about 5000 Å to about 10,000 Å.

20 Claims, 2 Drawing Sheets

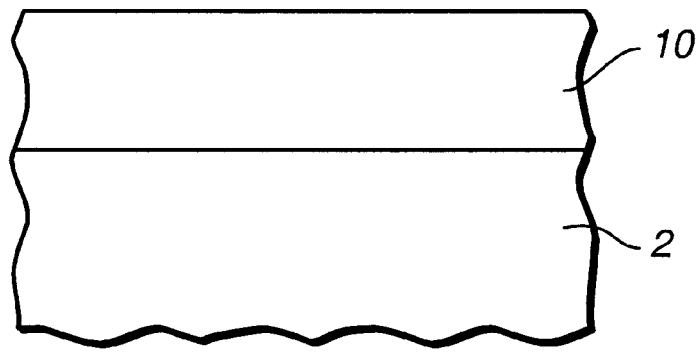
FIG._1
*(PRIOR ART)*
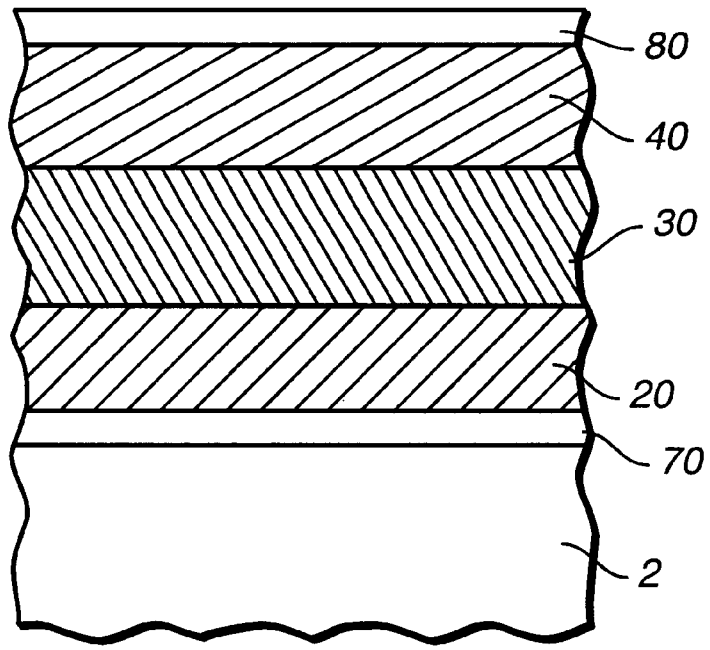
FIG._3

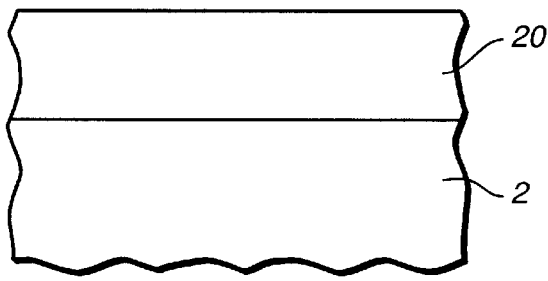
FIG._2a
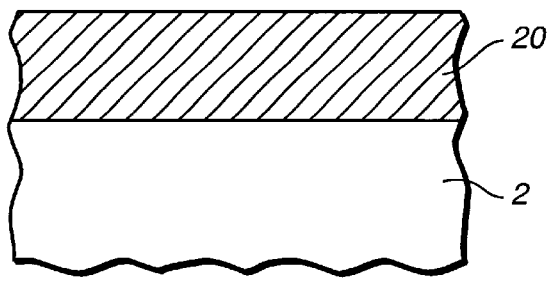
FIG._2b
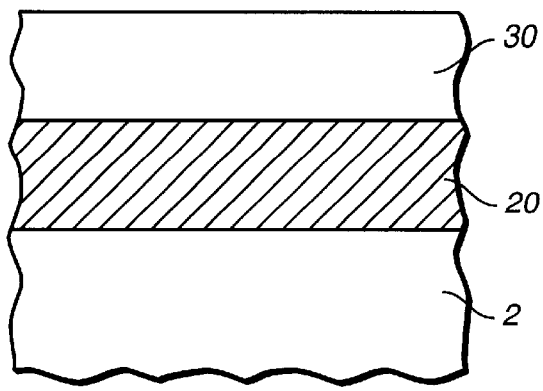
FIG._2c
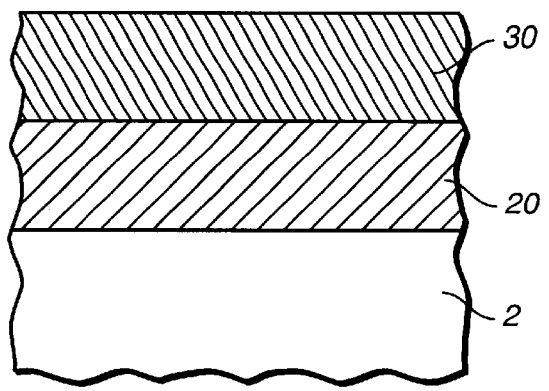
FIG._2d
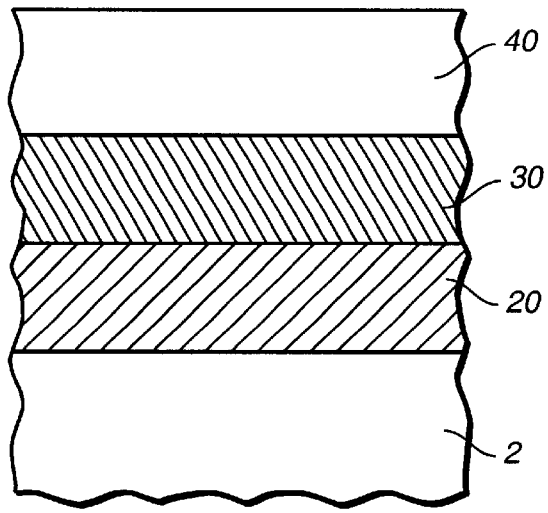
FIG._2e
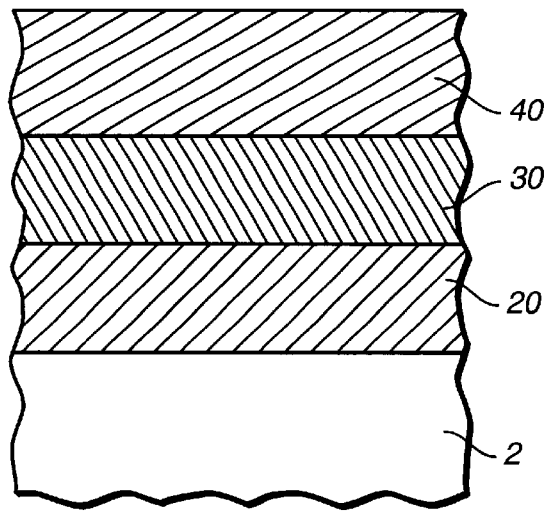
FIG._2f

PROCESS TO PREVENT STRESS CRACKING OF DIELECTRIC FILMS ON SEMICONDUCTOR WAFERS

BACKGROUND OF THE INVENTION

1. Field of the Invention

This invention relates to integrated circuit structures. More particularly, this invention relates to a process for treating dielectric films to prevent cracking after deposition on a semiconductor wafer.

2. Description of the Related Art

The steps of manufacturing an integrated circuit structure include the deposition of a plurality of layers onto the surface of a silicon wafer. Typically, these layers comprise either a conductive metallic material, such as tungsten or aluminum metals, or an insulating dielectric material, such as silicon oxide. The physical properties of these films play an important role in determining the quality of the film layers, and the interaction of the film layers with the silicon substrate. One important physical property which greatly effects the quality of a film layer and the interactions between the silicon substrate and the deposited film is residual stress, which can be either tensile or compressive with respect to the silicon wafer.

When a film exhibits tensile stress with respect to the silicon wafer, it tends toward forming a concave upper surface, which is caused by the film exerting a force directed away from the surface of the wafer. If the magnitude of the tensile stress is sufficient, the film may (1) crack and/or (2) pull away from the surface of the silicon wafer. These damaging effects may occur during the course of the integrated circuit manufacturing process, or at any time throughout the useful lifetime of the integrated circuit device.

In contrast, films exhibiting compressive stress, exert a force directed toward the surface of the wafer (and tend toward having a convex upper surface). Although compressive stress may not cause as much damage as tensile stress, if the compressive stress is of a great enough magnitude in a given film layer, the highly stressed film layer may exert damaging stress on an adjacent film layer. Therefore, ideally, a film layer which does not exhibit any residual stress is optimal for forming a high quality, stable film layer.

In practice, every film layer deposited on a silicon wafer exhibits some degree of residual stress. In an integrated circuit device having, for example, tungsten conductive metal layers and silicon oxide insulating dielectric layers, the metal layers exhibit tensile stress, while the silicon oxide layers exhibit compressive stress. The forces exerted in tensile stress and compressive stress are opposite in directionality. Therefore, the tensile and compressive stresses respectively exhibited by the tungsten metal and silicon oxide dielectric layers combine in such a way that the overall stress of the composite of metal and dielectric film layers is reduced. The lowering of accumulated stress by placement of layers with opposing stresses is effective when the magnitudes of the stresses are small, i.e., less than $10^{10}$ dynes/centimeter$^2$ (dynes/cm$^2$) in magnitude. However, use of a large amount of compressive stress to compensate for a large amount of tensile stress may also lead to a cracking of the films making up the various metal and dielectric layers. Therefore, an effective construction of an integrated circuit device comprises metal layers having low magnitudes of tensile stress, and dielectric layers having low magnitudes of compressive stress.

Although it may be preferable to have neither tensile nor compressive stress exerted by the various metal and dielectric layers on the silicon wafer, in practice, the quality of the integrated circuit devices may be more effectively maintained by having a small amount of compressive stress exerted by the composite of metal and dielectric layers rather than having a small amount of tensile stress exerted by the layers.

The conventional method of depositing a dielectric layer includes a continuous deposition of dielectric material onto an integrated circuit structure until the desired thickness has been attained. For the purposes of this invention, an integrated circuit structure may comprise a silicon wafer, with various components formed therein, including active devices, dielectric layers, underlying metal lines, oxide-filled dielectric trenches, etc. The prior art continuous deposition of a dielectric layer results in a structure as seen in prior art FIG. 1: a thick, single layer of a dielectric film 10, deposited onto an integrated circuit structure 2. When the dielectric layer made using the prior art process consists of silicon oxide, the layer, after heat treatment, exerts a compressive stress on the underlying integrated circuit structure.

While dielectric materials such as silicon oxide have been conventionally used in the construction of integrated circuit structures to electrically separate and isolate or insulate conductive elements of the integrated circuit structure from one another, as the spacing between such conductive elements in the integrated circuit structure have become smaller and smaller, the capacitance between such conductive elements through the silicon oxide dielectric material has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by silicon oxide insulation, as the scale of integrated circuit structures continues to reduce, the use of other insulation materials having dielectric constants (k values) lower than conventional silicon oxide (which has a k value of about 4) has been proposed. One such class of material is a carbon doped silicon oxide material wherein at least a portion of the oxygen atoms, bonded to the silicon atoms in a traditional silicon oxide material, are replaced by one or more organic groups such as, for example, an alkyl group such as a methyl ($CH_3$—) group. These low k carbon doped silicon oxide dielectric materials have dielectric constants varying from about 2.5 to about 3.5 and are, therefore, of great interest as low dielectric constant substitutes for the conventional silicon oxide insulation material.

Certain low k dielectric layers, however, exhibit tensile stress when deposited as a thick single layer of dielectric film. In some low k films, such as porous ozone deposited films, a conventional post annealing step is sufficient to convert the residual stress of the film from tensile to compressive. However, other low k dielectric layers (such as, for example, low k carbon doped silicon oxide dielectric materials) exhibit tensile stress when deposited as a thick, single layer of dielectric film, and continue to exhibit tensile stress even after annealing. The presence of a dielectric layer with tensile stress, deposited as a thick, single layer of dielectric film onto one or more metal layers which also exhibit tensile stress, results in an integrated circuit device in which the deposited layers tend to crack and detach from the surface of the silicon wafer, resulting in damage to and even failure of the integrated circuit device.

It would, therefore, be desirable to provide a method for treating a film layer of a dielectric material located on an integrated circuit structure in such a manner that the film exhibits compressive stress following the post anneal step.

SUMMARY OF THE INVENTION

In accordance with the invention, a process is provided for forming a dielectric film having a compressive stress exhibited in the layers deposited onto an integrated circuit structure to thereby inhibit stress cracking of the dielectric film. This process includes depositing a first thin layer of dielectric material onto an integrated circuit structure, then exposing the integrated circuit structure to an elevated temperature, and then depositing a second thin layer of dielectric material overlying the first thin layer of dielectric material, and then exposing the integrated circuit structure to an elevated temperature for a second time. The process is carried out in such a manner to insure that the composite layer comprising the first and second deposited thin dielectric layers, after heat treatment, exhibits a residual stress which is preferably compressive. The steps of depositing an additional thin dielectric layer and then exposing the semiconductor wafer to an elevated temperature may be iterated until a sufficient composite thickness of dielectric material has been formed, typically about 5000 Å to about 10,000 Å. In one embodiment of the invention, the dielectric material used in forming the various thin dielectric layers comprises a low k dielectric material.

BRIEF DESCRIPTION OF THE DRAWINGS

Prior art FIG. 1 illustrates the structure of a thick dielectric layer, as deposited using the process of the prior art.

FIG. 2 demonstrates the iterative steps of the invention, comprising: (a) steps of deposition in FIGS. 2a, 2c, and 2e; and (b) steps of exposure to an elevated temperature in FIGS. 2b, 2d, and 2f.

FIG. 3 depicts a structure produced using an alternative embodiment of the method of the invention, in which base and capping PECVD layers are respectively deposited before the first thin dielectric layer has been deposited, and after the final thin dielectric layer has been exposed to an elevated temperature.

DETAILED DESCRIPTION OF THE INVENTION

The invention provides a process for forming an integrated circuit device with two or more thin layers of a dielectric film exhibiting compressive stress, wherein the dielectric film, when deposited by conventional methods (i.e., as a thick dielectric film), would exhibit tensile stress. Specifically, the invention includes iterative cycles of: (1) depositing a thin dielectric film and (2) exposing the integrated circuit structure to an elevated temperature; which cycles are continued until a composite dielectric layer of a desired thickness has been deposited.

The process of the invention comprises a method for depositing a composite of dielectric films in such a manner that the composite of films, after heat treatment, exhibits compressive stress which, when otherwise deposited by conventional methods (i.e., as a thick, single layer of dielectric film) still exhibit tensile stress after heat treatment. The process of the invention is a multi-step process, the steps of which are exemplified in FIG. 2. A thin dielectric layer 20, is deposited onto integrated circuit structure 2, as shown in FIG. 2(a). The structure is then exposed to an elevated temperature (heat treatment), as shown in FIG. 2(b). After maintaining the structure at an elevated temperature, a second thin dielectric layer 30 is deposited, as shown in FIG. 2(c). The integrated circuit structure is again exposed to an elevated temperature, as shown in FIG. 2(d). The steps of deposition and heat treatment may be further iterated, forming a third thin dielectric layer 40, as shown in FIG. 2(e) and then the structure is exposed to an elevated temperature as shown in FIG. 2(f).

For the purposes of the invention, the term "thick dielectric layer" will be understood to mean a layer of dielectric material, deposited in a single deposition reaction, which has a thickness greater than or equal to 5000 Å.

For the purposes of the invention, the term "thin dielectric layer" will be understood to mean a layer of dielectric material, deposited in a single deposition reaction, which has a thickness less than 5000 Å.

For the purposes of the invention, the term "thick composite dielectric layer" will be understood to mean a composite of two or more thin dielectric layers.

While we do not wish to be bound by any theories, the process of depositing a thin dielectric layer onto an integrated circuit structure, and then exposing the integrated circuit structure to an elevated temperature (heat treatment) apparently hardens the thin dielectric layer. Whereas, for example, the thick low k dielectric layer of the prior art exhibits tensile stress even after heat treatment, this thinner, hardened low k dielectric layer exhibits compressive stress after heat treatment. Deposition of an immediately overlying second dielectric layer onto the hardened underlying first layer does not apparently result in a significant amount of intercalation, or continuity of lattice structure, or other manner of communication between adjacent dielectric layers. As a result, a layer of, for example, low k dielectric material of conventional thickness, which normally exhibits tensile stress, may be deposited as a composite or series of overlying, apparently non-communicating thin dielectric layers, which composite exhibits compressive stress.

The process of the invention is typically carried out to form a composite dielectric layer capable of electrically isolating conductive layers, as well as capable of preventing undesirable levels of capacitance to form between conductive layers, while still exhibiting compressive stress. Typically, the overall thickness of such a composite dielectric layer ranges from about 5000 Å to about 10,000 Å, preferably about 6000 Å.

While it may be possible to deposit this composite layer as a series of very thin individual layers (e.g., each less than 10 Å) of dielectric material, such very thin layers are not required to properly carry out the process of the invention. Furthermore, use of very thin layers may require a large number of deposition/heat treatment cycles (e.g., more than 10 deposition/heat treatment cycles) to be carried out in order to deposit a composite dielectric layer of sufficient thickness. A large number of cycles is to be avoided because it may lead to: (1) an undesirably large amount of time required in depositing the composite dielectric layer; and (2) the large number of heat treatment steps (one heat treatment step per cycle) deleteriously affecting the thermal budget of the integrated circuit device. Therefore, for practical considerations, each of the individual dielectric layers should be greater than about 500 Å in thickness, preferably greater than about 1000 Å in thickness, more preferably greater than about 1500 Å in thickness.

The maximum thickness of each thin dielectric layer preferably should not exceed a thickness which enables the deposited/heat treated layer to exhibit compressive stress, i.e., less than about 5000 Å, preferably less than about 3000 Å, more preferably less than about 2500 Å.

Thus, the thickness of the individual thin dielectric layers, deposited in accordance with the invention, should preferably range in thickness from about 500 Å to less than about 5000 Å in thickness, more preferably from about 1000 Å to about 3000 Å in thickness, most preferably from about 1500 Å to about 2500 Å in thickness, and typically about 2000 Å in thickness.

It should be noted, however, that while the invention envisions the formation of a composite of dielectric layers, each thin enough to exhibit compressive stress after heat treatment, it is within the scope of the invention to use one or more dielectric layers which are not thin enough to exhibit compressive stress after heat treatment in combination with one or more thin dielectric layers which do exhibit compressive stress after heat treatment, provided that the residual stress in the resulting composite of dielectric layers is less than the tensile stress of a single dielectric layer of equivalent thickness to the composite.

The number of deposition/heat treatment cycles used in the process of the invention may be determined based on the thickness of the individual dielectric films deposited relative to the desired overall thickness of the composite dielectric layer, which comprises a series of such individual dielectric films. For example, a process, in which each individual dielectric film is about 2000 Å in thickness, must undergo three deposition/heat treatment cycles to provide a composite dielectric layer with an overall thickness of about 6000 Å. Thus, the number of deposition/heat treatment cycles used in the process of the invention may vary from 1 to 10 deposition/heat treatment cycles, according to the desired thickness of the composite layer, preferably the number of deposition/heat treatment cycles used are from 2 to 5 deposition/heat treatment cycles, and typically will comprise 3 deposition/heat treatment cycles.

If the specific type of dielectric material deposited according to the process of the invention retains by-product molecules, e.g., moisture, capable of damaging one or more underlying active devices, a protective base layer 70, as shown in FIG. 3, comprising a material such as silicon oxide, may be deposited in a step prior to the cyclic steps of depositing the thin dielectric film and exposing the integrated circuit device to an elevated temperature. The step of depositing a base layer may be carried out, for example, using plasma enhanced chemical vapor deposition (PECVD).

If the specific type of dielectric material deposited according to the process of the invention is susceptible to degradation and/or damage upon exposure to certain chemical reagents used in the various processing steps (e.g., oxidants used in photoresist ash steps), a protective capping PECVD layer 80, comprising a material such as silicon oxide, may be deposited onto the uppermost thin dielectric layer deposited in the process of the invention, wherein this protective capping layer is deposited after a heat treatment step subsequent to deposition of the uppermost thin dielectric layer. That is, the uppermost thin dielectric layer is deposited and then subjected to a heat treatment step, and then the protective capping layer is formed over the heat treated uppermost thin dielectric layer. The protective base and capping PECVD layers may each comprise silicon oxide, silicon nitride, or any other dielectric material capable of protecting an adjacent reagent-sensitive portion of the integrated circuit structure from degradation.

The process of the invention may be useful for any dielectric material which, when deposited as a single thick layer of dielectric film and annealed, yields a film exhibiting tensile stress, but is capable of being converted to a film with compressive stress when deposited as a composite of thin layers which are each separately heat treated. The process of the invention is especially useful for dielectric films comprising low k materials, and in particular for the conversion of low k carbon doped silicon oxide dielectric materials from exhibiting tensile stress to exhibiting compressive stress.

The heating step may be carried out in any chamber capable of achieving and maintaining an elevated temperature. The heating source may be radiative (such as the heating lamps in a flow treatment station, or FTS) or conductive (such as a heated wafer support, or the heat convection of a deposition chamber such as a PECVD chamber), or any other heating source such as a furnace. The integrated circuit structure will typically be heated from a starting temperature of about 20° C. to at least about 400° C. over a time period of about 180 seconds. The integrated circuit device is exposed to the elevated temperature for a time of from about 60 seconds to about 180 seconds, after which, the integrated circuit structure is cooled to about 20° C. over a time period of about 60 seconds. While longer heating times may be used, they should be avoided to conserve the thermal budget (total exposure time of the structure to elevated temperatures). The temperature may be higher, however, care must be taken to not damage the underlying integrated circuit structure or to unduly affect the thermal budget of the integrated circuit device. Typically, the temperature may range from about 300° C. to about 500° C., preferably at least about 350° C.

The chamber in which the heat treatment step takes place may contain any unreactive gas such as nitrogen, helium, argon, or any other gas which does not react with the silicon substrate or any of the deposited films thereon, during the heat treatment step of the invention. Alternatively, the chamber may be under vacuum.

After the final deposition/heat treatment step is carried out in accordance with the invention, the semiconductor wafer may be optionally treated with a post anneal process. The post anneal process is carried out at a temperature ranging from about 350° C. to about 450° C., over a time period of about 15 minutes to about 45 minutes. If a capping silicon oxide layer such as a PECVD layer is deposited, this post anneal step will typically be carried out after deposition of the capping silicon oxide layer over the final thin dielectric film, deposited in accordance with the invention. Whether a capping silicon oxide layer is deposited or not, this post anneal process is an optional process (i.e., the post anneal step is not a required step in the event that a capping layer is deposited).

After the final deposition/heat treatment step and the optional post anneal step, the wafer may then undergo any of a plurality of additional steps which are utilized in the construction of an integrated circuit structure, including, for example, photoresist mask deposition, etching and ashing; metal layer deposition; chemical mechanical polishing; and any other step required to complete the construction of the integrated circuit device.

Thus, the invention provides a treatment process which permits a thick layer of dielectric material to be deposited in such a way that the dielectric material exhibits compressive stress onto an integrated circuit device. The process of the invention accomplishes this by depositing multiple, thin overlying compressive layers of the dielectric material onto the integrated circuit device, and individually heat treating each layer prior to deposition of the next layer.

To further illustrate the invention, onto three silicon wafers were deposited films of a low k carbon doped silicon oxide dielectric material. The first wafer received a PECVD silicon oxide base layer of 500 Å in thickness, followed by a single, 6000 Å thick layer of low k carbon doped silicon oxide dielectric material formed by reacting carbon-doped silane with hydrogen peroxide, which was capped with a 3000 Å PECVD silicon oxide layer. The second wafer had the same base layer deposited, but then was treated by deposition of a 2000 Å low k carbon doped silicon oxide dielectric material formed by reacting carbon-doped silane with hydrogen peroxide, followed by a 90 second exposure to a temperature of 350° C. in a PECVD chamber under a nitrogen atmosphere. The second wafer was then treated with two additional cycles of the same deposition/heat treatments, and then capped with a 3000 Å PECVD silicon oxide layer. The third wafer was treated by deposition of the same base layer, followed by deposition of a 2000 Å low k carbon doped silicon oxide dielectric material, followed by 180 seconds at 400° C. in a FTS. This third wafer was treated by two additional cycles of a 2000 Å deposition followed by heat treatment in a FTS, and then capped with a 3000 Å layer of a PECVD silicon oxide.

After deposition of the capping PECVD silicon oxide layer on the three wafers, the respective residual stress in each of the three wafers was measured. Next, the three wafers were subjected to a post annealing step at 400° C. for 30 minutes. After the post annealing step, the residual stress in the three wafers was again measured. The first wafer, in which a single thick low k carbon doped silicon oxide dielectric layer was deposited, exhibited a residual stress of $2.75 \times 10^7$ dynes/cm$^2$ (tensile stress) before the post annealing step and $6.45 \times 10^8$ dynes/cm$^2$ (tensile stress) after the post annealing step. The second wafer, treated in accordance with the invention, and specifically heat treated in a PECVD chamber, exhibited a residual stress of $-3.48 \times 10^7$ dynes/cm$^2$ (compressive stress) before the post annealing step and $-2.45 \times 10^8$ dynes/cm$^2$ (compressive stress) after the post annealing step. The third wafer, also treated in accordance with the invention, but specifically heat treated in an FTS chamber, exhibited a residual stress of $-1.76 \times 10^7$ dynes/cm$^2$ (compressive stress) before the post annealing step and $-2.14 \times 10^8$ dynes/cm$^2$ (compressive stress) after the post annealing step.

Thus the process of the invention, comprising depositing a plurality of contiguous thin layers of a dielectric film, wherein a step of exposing the substrate to an elevated temperature is carried out subsequent to a previous deposition step, and prior to the next deposition step, is shown to be effective in forming a composite dielectric layer of a low k carbon doped silicon oxide dielectric material exhibiting acceptable compressive stress after the post anneal.

Having thus described the invention, what is claimed is:

1. A process for forming an integrated circuit device comprising a composite dielectric layer which exhibits compressive stress, comprising the steps of:
   a) depositing a first layer of dielectric material onto a semiconductor wafer;
   b) then exposing said semiconductor wafer to an elevated temperature;
   c) then depositing a second layer of the same dielectric material overlying said first layer of dielectric material; and
   d) again exposing said semiconductor wafer to an elevated temperature;
whereby said composite layer comprising said first and second layers of the same dielectric material exhibits compressive stress on said semiconductor wafer.

2. The process of claim 1 wherein said step of depositing a first layer of dielectric material further comprises depositing a first thin layer of dielectric material, and said step of depositing a second layer of dielectric material further comprises depositing a second thin layer of dielectric material immediately overlying said first thin layer of dielectric material.

3. The process of claim 2 where each of said thin dielectric layers has a thickness less than about 5000 Å.

4. The process of claim 2 wherein steps c) and d) are repeated until the total thickness of the deposited dielectric layers ranges from about 5000 Å to about 10,000 Å.

5. The process of claim 2 wherein steps c) and d) are repeated once or twice.

6. The process of claim 2 wherein said steps of depositing said first and said second thin layers of dielectric material onto said semiconductor wafer each further includes depositing a low k dielectric material onto said semiconductor wafer.

7. The process of claim 2 wherein said steps of depositing said first and said thin second layers of dielectric material onto said semiconductor wafer each further includes depositing a low k carbon doped silicon oxide dielectric material onto said semiconductor wafer.

8. The process of claim 2 wherein said step of exposing said semiconductor wafer to an elevated temperature takes place for a time period ranging from about 60 to about 120 seconds.

9. The process of claim 2 wherein said elevated temperature is a temperature ranging from about 300° C. to about 500° C.

10. The process of claim 2 wherein, prior to deposition of said first thin layer of dielectric material, a layer of silicon oxide having a thickness of from about 100 Å to about 1000 Å is deposited on said semiconductor wafer.

11. The process of claim 2 wherein, subsequent to deposition of said second thin layer of dielectric material, a capping layer of silicon oxide having a thickness of from about 100 Å to about 3000 Å is deposited on said semiconductor wafer.

12. The process of claim 2 wherein, subsequent to deposition of said second thin layer of dielectric material, said semiconductor wafer is treated by a post anneal process, including exposure to a temperature from about 350° C. to about 450° C. for a time period ranging from about 15 minutes to about 45 minutes.

13. The process of claim 1 wherein at least one of said steps of depositing a first layer of dielectric material and depositing a second layer of dielectric material further comprises depositing a thin layer of dielectric material, and one of said steps of depositing a dielectric material further comprises depositing a layer of dielectric material which is not a thin layer of dielectric material.

14. A process for forming an integrated circuit device comprising a composite dielectric layer which exhibits compressive stress, comprising the steps of:
   a) depositing from about 1000 Å to about 3000 Å of a first thin layer of low k dielectric material onto a semiconductor wafer;
   b) exposing said semiconductor wafer to a temperature of at least about 300° C.;
   c) then depositing from about 1000 Å to about 3000 Å of a second thin layer of low k dielectric material immediately overlying said first layer of low k dielectric material;
   d) again exposing said semiconductor wafer to a temperature of at least about 300° C.; and e) repeating steps c) and d) until the overall thickness of the layers is from about 5000 Å to about 10,000 Å;

whereby said resulting composite layer exhibits compressive stress on said semiconductor wafer.

15. The process of claim 14 wherein steps c) and d) are repeated once or twice.

16. The process of claim 14 wherein said steps of depositing said first and said second thin layers of low k dielectric material onto said semiconductor wafer each further includes depositing a low k carbon doped silicon oxide dielectric material onto said semiconductor wafer.

17. The process of claim 14 wherein said step of exposing said semiconductor wafer to an elevated temperature takes place for a time period ranging from about 60 to about 180 seconds.

18. The process of claim 14 wherein, prior to deposition of said first thin layer of low k dielectric material, a base layer of silicon oxide having a thickness of from about 100 Å to about 1000 Å is deposited on said semiconductor wafer.

19. The process of claim 14 wherein, subsequent to deposition of a final thin layer of low k dielectric material, a capping layer of silicon oxide having a thickness of from about 100 Å to about 3000 Å is deposited on said semiconductor wafer.

20. A process for forming an integrated circuit device comprising a composite dielectric layer which exhibits compressive stress, comprising the steps of:

a) depositing a base layer of silicon oxide having a thickness of from about 100 Å to about 1000 Å, onto a semiconductor wafer;

b) then depositing from about 1000 Å to about 3000 Å of a first thin layer of low k carbon doped silicon oxide dielectric material onto said base layer of silicon oxide on said semiconductor wafer;

c) then exposing said semiconductor wafer to a temperature of about 350° C. to about 500° C. for at least about 60 seconds;

d) then depositing from about 1000 Å to about 3000 Å of a second thin layer of low k carbon doped silicon oxide dielectric material immediately overlying said first layer of low k carbon doped silicon oxide dielectric material;

e) then again exposing said semiconductor wafer to a temperature of about 350° C. to about 500° C. for at least about 60 seconds;

f) then repeating steps d) and e) until the overall thickness of the layers is from about 5000 Å to about 10,000 Å; and g) then depositing a capping layer of silicon oxide, having a thickness of from about 100 Å to about 3000 Å over said layers of low k silicon oxide dielectric material;

whereby said resulting composite layer exhibits compressive stress on said semiconductor wafer.

* * * * *